(12) United States Patent
Lee et al.

(10) Patent No.: US 7,497,963 B2
(45) Date of Patent: Mar. 3, 2009

(54) ETCHING METHOD

(75) Inventors: Kwang-Myung Lee, Suwon (KR);
Ki-Young Yun, Suwon (KR); Seung-Ki Chae, Suwon (KR); No-Hyun Huh, Suwon (KR); Wan-Goo Hwang, Suwon (KR); Jung-Hyun Hwang, Suwon (KR); Shinji Yanagisawa, Towada (JP); Kengo Tsutsumi, Susono (JP); Seiichi Takahashi, Ishioka (JP)

(73) Assignees: Samsung Electronics Co., Ltd., Kyungki-Do (KR); ULVAC, Inc., Kanagawa-Ken (JP)

( * ) Notice: Subject to any disclaimer, the term of this patent is extended or adjusted under 35 U.S.C. 154(b) by 0 days.

(21) Appl. No.: 11/032,393

(22) Filed: Jan. 10, 2005

(65) Prior Publication Data

US 2005/0153553 A1    Jul. 14, 2005

(30) Foreign Application Priority Data

Jan. 13, 2004    (JP)    ............................ P 2004-005219

(51) Int. Cl.
*B44C 1/22* (2006.01)
(52) U.S. Cl. .............................. 216/58; 216/67; 216/83; 216/53; 216/108; 216/109; 427/534; 427/569; 427/573; 427/579; 156/643; 156/646; 156/653; 156/662
(58) Field of Classification Search ................... 216/58, 216/67; 427/534, 569
See application file for complete search history.

(56) References Cited

U.S. PATENT DOCUMENTS 4,563,367 A * 1/1986 Sherman ...................... 427/563

(Continued)

FOREIGN PATENT DOCUMENTS

JP    2001-284307    10/2001

(Continued)

OTHER PUBLICATIONS

S.Rossnagel, Handbook of Plasma Processing Technology, Noyes Publications (199), pp. 198 and 227.*

(Continued)

*Primary Examiner*—Shamim Ahmed
*Assistant Examiner*—Maki Angadi
(74) *Attorney, Agent, or Firm*—Grossman, Tucker, Perreault & Pfleger, PLLC

(57) ABSTRACT

In this etching method, since an etching gas is introduced before introduction of free radicals into a processing chamber, the etching gas has been adsorbed on the surface of substrates when the free radicals are introduced. Accordingly, the free radicals react with the etching gas adsorbed on the surface of the substrates, and the reaction proceeds uniformly on the surface of the substrate. As a result, nonuniform etching does not occur on the surface of the substrate. Moreover, since the reaction between the etching gas and the free radicals occurs on the surface of the substrate, an intermediate product produced according to the reaction between the etching gas and the free radicals reacts with an etching object promptly. Therefore, the intermediate product is not exhausted from the processing chamber 12 excessively, and hence the etching efficiency is high. As a result, according to this etching method, not only the in-plane distribution of the etching amount becomes more uniform, but also the etching rate is increased more than in the conventional etching method.

11 Claims, 4 Drawing Sheets

U.S. PATENT DOCUMENTS 4,883,686 A * 11/1989 Doehler et al. .............. 427/562
5,302,236 A * 4/1994 Tahara et al. ................. 216/67

FOREIGN PATENT DOCUMENTS

JP        2003-124172        4/2003

OTHER PUBLICATIONS

S.Wolf, Silicon Processing for the VLSI Era, vol. 1, Lattice Press (1986), p. 573.*

S.Xu, Journal of Vacuum Science & Technology, vol. A 20(6), pp. 2123-2130, (2002).*

* cited by examiner

ETCHING METHOD

BACKGROUND OF THE INVENTION

1. Field of the Invention

The present invention relates to an etching method, and particularly relates to a dry etching method. Priority is claimed on Japanese Patent Application No. 2004-5219 filed on Jan. 13, 2004, the content of which is incorporated herein by reference.

2. Description of Related Art

Conventionally, the dry etching method has been widely used for etching an etching object arranged on a surface of a substrate (see Japanese Unexamined Patent Application, First Publication Nos. 2001-284307 and 2003-124172).

For example, when an etching object formed of a silicon oxide film formed on a surface of a silicon substrate is etched, there is a method in which the substrate is first arranged in a processing chamber, and after a vacuum atmosphere is formed in the processing chamber, an intermediate product reacting with the etching object is produced in the processing chamber. For example, when free radicals of a hydrogen gas and an etching gas such as a fluoride gas are supplied to the processing chamber, the etching gas is reduced, to produce an intermediate product such as $NH_xF_y$ (x and y are optional integers).

The intermediate product reacts with the etching object on the surface of the substrate, to produce a reaction product. When the substrate is heated, the reaction product is thermally decomposed to become a pyrolysis gas and is evaporated, and as a result, the etching object is removed from the surface of the substrate.

Thus, according to the dry etching method, the silicon oxide film can be removed by etching in the vacuum atmosphere, and hence the silicon substrate is not contaminated by moisture and oxygen in the air.

According to the conventional dry etching method, however, the in-plane distribution of the etching quantity with respect to the surface of the substrate becomes nonuniform. Particularly, when a plurality of substrates is etched simultaneously, the in-plane distribution of the etching amount and the etching rate becomes different for each substrate.

SUMMARY OF THE INVENTION

The present invention addresses the above problems in the conventional technique, with an object of providing an etching method in which the in-plane distribution of the etching amount becomes uniform, and the etching rate is fast.

In order to solve the above problems, according to a first aspect of the present invention, an etching method is provided in which free radicals formed from a radical formation gas and an etching gas are introduced into a vacuum atmosphere where a substrate having an etching object formed on the surface thereof is arranged, the free radicals, the etching gas and the etching object are allowed to react with each other to produce a reaction product, the substrate is heated to decompose the reaction product, thereby to produce a pyrolysis gas, and the pyrolysis gas is removed by evacuation, wherein the vacuum atmosphere is set in a first pressure range, the etching gas is introduced into the vacuum atmosphere to set a second pressure range having a higher pressure than the first pressure range, and the free radicals are introduced into the vacuum atmosphere, while maintaining the second pressure range, to produce a reaction product.

According to a second aspect of the present invention, an etching method according to the first invention is provided, wherein the substrate is heated after setting the pressure in the vacuum atmosphere to a third pressure range lower than the second pressure range.

According to a third aspect of the present invention, an etching method according to the first or the second invention is provided, wherein the second pressure range is a pressure equal to or higher than $6.67 \times 10$ Pa.

According to a fourth aspect of the present invention, an etching method according to the third invention is provided, wherein the second pressure range is a pressure equal to or lower than $1.33 \times 10^3$ Pa.

According to a fifth aspect of the present invention, an etching method according to any one of the first to the fourth invention is provided, wherein a fluoride gas which does not contain carbon and oxygen but contains fluorine in the chemical structure is used as the etching gas, and either one or both of a hydrogen gas and an ammonia gas are used as the radical formation gas, to etch an etching object formed of a silicon oxide.

In the conventional etching method, since the etching gas is introduced into the vacuum atmosphere together with the free radicals, an intermediate product is produced in the vacuum atmosphere. Accordingly, the reaction between the etching object and the intermediate product depends on the amount of the intermediate product flowing in the vacuum atmosphere, and it is considered that the etching rate slows down because the intermediate product is exhausted from the vacuum atmosphere without reacting with the etching object.

When etching is performed while the substrate is stationary, the intermediate product first reaches a portion close to an introduction port of the etching gas and the free radicals, and later reaches a portion far from the introduction port. Moreover, when etching is performed while rotating the substrate, the intermediate product first reaches the end of the substrate, and later reaches the central part of the substrate. In either case, since the reaction between the intermediate product and the etching object begins from the portion where the intermediate product reaches first, it is presumed that nonuniform etching occurs between the portion where the intermediate product reaches first and the portion where the intermediate product reaches later.

On the other hand, in the etching method of the present invention, the etching gas is first introduced into the vacuum atmosphere during evacuation, without introducing the free radicals into the vacuum atmosphere. Therefore, if a nozzle for the etching gas faces the center of the substrate, the etching gas flows through the central part on the surface of the substrate, and the etching gas is adsorbed onto the surface of the substrate.

At this time, when the substrate is rotated in a horizontal plane, the whole range of the substrate comes to contact with the flow of the etching gas from the central part.

When the etching gas is first introduced, if the pressure of the vacuum atmosphere in which the substrate is placed is set to the second pressure range higher than the first pressure range, the flow of the high-density etching gas comes in contact with the surface of the substrate, and the etching gas is uniformly adsorbed on the surface of the substrate, so that the surface of the substrate is covered with the etching gas.

Then when the free radicals are introduced into the vacuum atmosphere during evacuation, if a nozzle for the free radicals faces the center of the substrate, the flow of the free radicals passes through the central part of the substrate, and is exhausted from the vacuum atmosphere. At this time, the free radicals react with the etching gas adsorbed on the surface of the substrate, to produce the intermediate product. As a result, nonuniform etching does not occur.

Moreover, by producing the intermediate product on the surface of the substrate, the intermediate product promptly reacts with the etching gas, and the intermediate product is not wastefully exhausted from the vacuum atmosphere. As a result, the etching rate becomes faster than in the conventional method.

If the second pressure range is set equal to or higher than $6.67\times10$ Pa (0.5 Torr), the etching gas is adsorbed on the surface of the substrate more uniformly, before introducing the free radicals. As a result, the in-plane distribution of the etching amount becomes more uniform.

Furthermore, if the pressure in the vacuum atmosphere is too high at the time of introduction of the free radicals, the production efficiency of free radicals decreases, so that not only the etching rate decreases, but also the production of the intermediate product before reaching the substrate becomes predominant. As a result, the in-plane distribution of the etching amount becomes nonuniform. Therefore, it is desired to set the second pressure range equal to or lower than $1.33\times10^3$ Pa (10 Torrs).

When the pressure in the vacuum atmosphere is in a range of from $1.33\times10^2$ Pa (1 Torr) to $1.33\times10^3$ Pa (10 Torrs) inclusive, the production efficiency of free radicals becomes particularly high, thereby increasing the etching rate.

Moreover, if the etching gas is introduced together at the time of introducing the radical formation gas, the etching gas consumed on the surface of the substrate is replenished, and as a result, the etching efficiency becomes higher.

Furthermore, if the pressure in the processing atmosphere is maintained constant by controlling the exhaust rate at the time of introducing the radical formation gas, etching is performed stably, and as a result, the in-plane distribution of etching becomes more uniform.

When a silicon substrate is used as the substrate, a silicon oxide film, being the etching object, is formed on the surface thereof. As a result, if a nitrogen trifluoride ($NF_3$) gas, being a fluoride gas, is used as the etching gas, the nitrogen trifluoride gas is adsorbed on the surface of the silicon substrate.

Next when the radical formation gas is changed into plasma, to produce free radicals (H·) of the hydrogen gas, as shown in the following reaction formula (1), the nitrogen fluoride gas adsorbed on the surface of the silicon substrate reacts with the free radicals of the hydrogen gas, to produce an intermediate product ($NH_xF_y$ (x and y are optional integers)).

$$H\cdot + NF_3 \rightarrow NH_xF_y \qquad (1)$$

Since the intermediate product has high reactivity with silicon oxide, as shown in the following reaction formula (2), a silicon oxide film ($SiO_2$) formed on the surface of the silicon substrate reacts with the intermediate product, to produce a reaction product (($NH_4$)$_2SiF_6$).

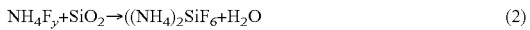

$$NH_4F_y + SiO_2 \rightarrow ((NH_4)_2SiF_6 + H_2O \qquad (2)$$

Next, when the silicon substrate is heated to 100° C. or higher, the reaction product is thermally decomposed and evaporated, and a pyrolysis gas as shown in the following reaction formula (3) is released into the vacuum atmosphere.

$$((NH_4)_2SiF_6 \rightarrow NH_3 + HF + SiF_4 \qquad (3)$$

Thus, if the fluoride gas is used as the etching gas, an intermediate product having high reactivity with the silicon oxide is produced. As a result, the silicon oxide film is selectively etched and removed from the surface of the silicon substrate.

According to the present invention, before introducing the radical formation gas, the etching gas is adsorbed on the surface of the substrate, and the intermediate product is produced on the surface of the substrate. As a result, nonuniform etching is reduced. Moreover, the intermediate product produced on the surface of the substrate promptly reacts with the etching object on the surface of the substrate. As a result, the etching rate is increased as compared with the conventional etching method. Furthermore, even when a plurality of substrates is processed simultaneously, the etching gas is adsorbed on the respective substrates beforehand, so that the reaction proceeds uniformly. As a result, a difference in in-plane distribution of the etching amount due to a difference in the substrate position inside the processing chamber does not occur.

DETAILED DESCRIPTION OF THE INVENTION

An embodiment of the present invention will be described with reference to the drawings.

Figure 1:
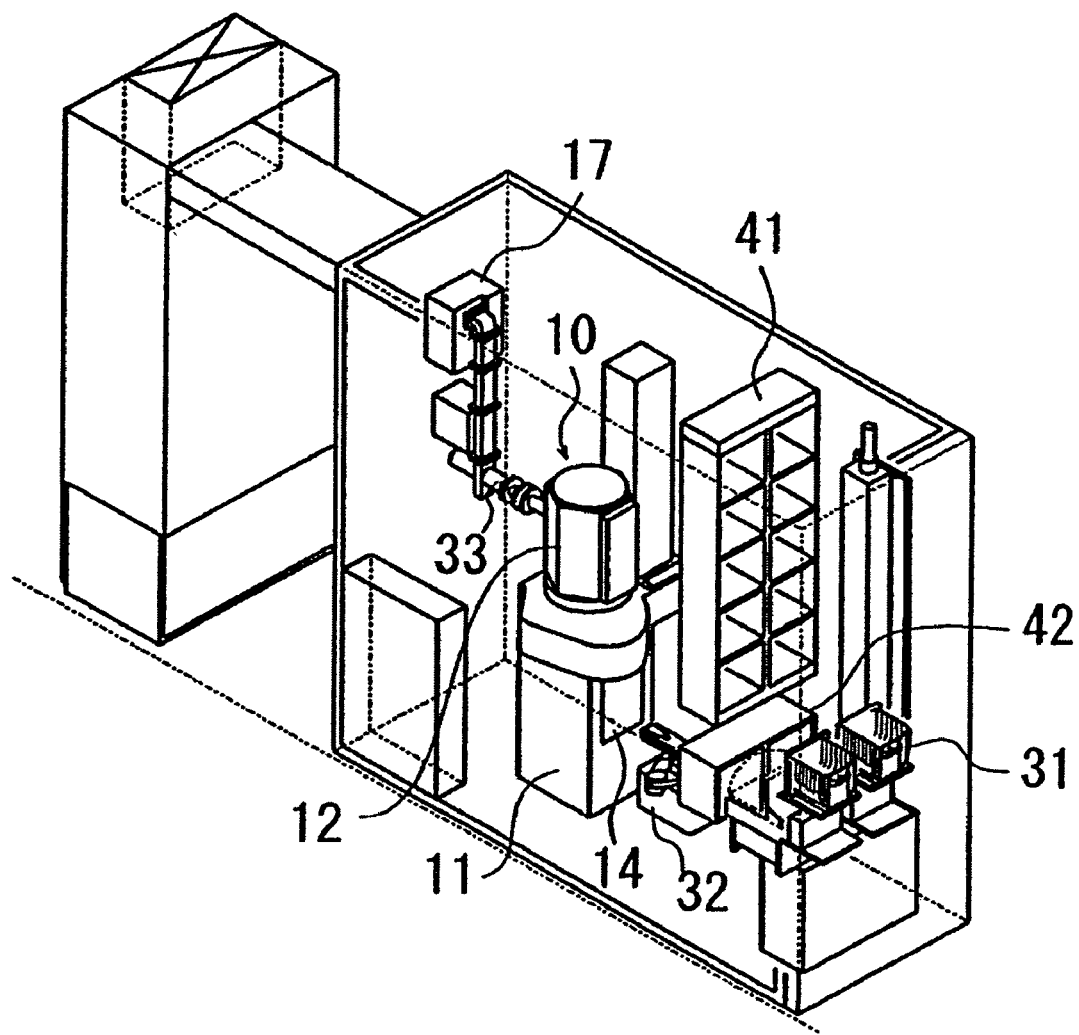
FIG. 1 is a perspective view for explaining one example of an etching apparatus used in the present invention.

Reference symbol 5 in FIG. 1 indicates one example of the etching apparatus used for the present invention. The etching apparatus 5 has an etching chamber 10. The etching chamber 10 has a processing chamber 12 and a transfer chamber 11 connected to the processing chamber 12. A transfer port 14 is provided in a sidewall of the transfer chamber 11, a workbench 42 is placed in the vicinity of the transfer port 14, and a transfer robot 32 is arranged between the workbench 42 and the transfer port 14.

Two or more substrates are stored together in the same cassette 31, and a cassette 31 storing unprocessed substrates is placed on the workbench 42. After the substrate is taken out from the cassette 31 one by one by the transfer robot 32, the substrate is carried into the transfer chamber 11 through the transfer port 14.

Moreover the processed substrate is taken out one by one by the transfer robot 32 from the transfer chamber 11 through the transfer port 14, and then stored in the cassette 31 placed on the workbench 42.

A cassette chamber 41 is arranged above the workbench 42, and the cassette 31 storing unprocessed substrates is carried into the etching apparatus 5, temporarily arranged in the cassette chamber 41, and then transferred onto the workbench 42. The cassette 31 storing processed substrates is temporarily returned to the cassette chamber 41 from the workbench, and then carried out to the outside of the etching apparatus 5.

Figure 2:
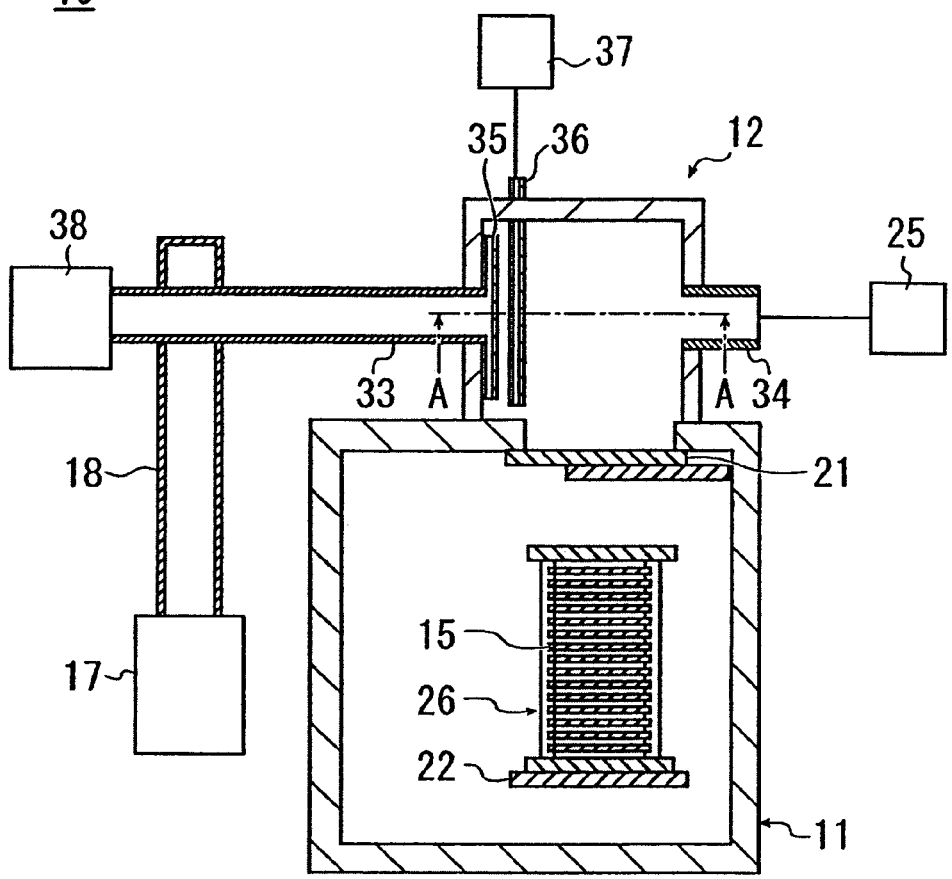
FIG. 2 is a sectional view for explaining one example of an etching chamber used in the present invention.

FIG. 2 is a sectional view of the etching chamber 10. A table 22 is arranged in the transfer chamber 11, and a boat 26 is mounted on the table 22.

The boat 26 has two or more support rods arranged in a standing condition in the vertical direction. Two or more grooves are respectively provided on the respective support rods with a certain interval, and the grooves on the respective support rods are respectively positioned at the same height. Therefore, when the substrates carried into the transfer chamber 11 are placed in the grooves of the support rods, the substrates are held substantially horizontally, with a certain spacing therebetween. FIG. 2 shows a state in which a plurality of substrates 15 is loaded in the boat 26 in the transfer chamber 11.

The table 22 can be moved vertically by an elevating mechanism (not shown), and when the table 22 is elevated by the elevating mechanism, the boat 26 moves upward together with the table 22.

An opening for connecting the inner space of the transfer chamber 11 to the inner space of the processing chamber 12 is provided on the ceiling of the transfer chamber 11, at a position directly above the table 22. The diameter of the opening is larger than that of the substrate 15, but smaller than that of the table 22. As a result, when an opening and closing valve 21 is opened, and the table 22 is lifted straight up, in the state with the transfer chamber 11 connected to the processing chamber 12, the substrate 15 passes through the opening together with the boat 26, and is carried into the processing chamber 12, but the table 22 does not pass through the opening, and the surface of the table 22 is pressed against the ceiling around the opening.

An O-ring surrounding the opening is fitted to the ceiling of the transfer chamber 11, and when the surface of the table 22 is pressed against the ceiling around the opening, the surface of the table 22 and the O-ring stick to each other, and hence the inner space of the processing chamber 12 is shut off from the transfer chamber 11.

Outside of the processing chamber 12 are arranged an evacuation system 25, an etching gas supply system 37, a radical formation gas supply system 38, and a microwave source 17. One end of an exhaust pipe 34 is fitted to the sidewall of the processing chamber 12, and the other end of the exhaust pipe 34 is connected to the evacuation system 25. When the evacuation system 25 is activated, the inside of the processing chamber 12 is evacuated via the exhaust pipe 34.

A shower nozzle 35 is fitted to the sidewall of the processing chamber 12 opposite to the exhaust pipe 34. One end of a gas pipe 33 is connected to the shower nozzle 35, and the other end of the gas pipe 33 is connected to the radical formation gas supply system 38. As a result, the gas supplied from the supply system 38 is introduced to the shower nozzle 35. At the end of the shower nozzle 35, a plurality of exhaust nozzles is provided directed towards the inside of the processing chamber 12 (towards the center of the substrates 15 carried into the processing chamber 12), and the gas introduced to the shower nozzle 35 is introduced into the processing chamber 12 via the respective exhaust nozzles.

One end of a waveguide 18 is connected to the microwave source 17, and the gas pipe 33 is penetrated through the other end of the waveguide 18. When the microwave source 17 is activated while flowing the gas through the gas pipe 33, the microwaves produced by the microwave source 17 are transmitted to the inside of the waveguide 18, and to the gas pipe 33 via the portion of the waveguide 18 penetrated by the gas pipe 33. As a result, the gas flowing in the gas pipe 33 is excited by the microwaves, thereby forming the free radicals. The free radicals are carried to the shower nozzle 35 together with the flow of the carrier gas and the unreacted radical formation gas, and introduced from the exhaust nozzles of the shower nozzle 35 into the processing chamber 12.

In other words, since the microwaves are irradiated to partway along the route through which the gas is supplied into the processing chamber 12, the microwaves are not irradiated to the substrate arranged inside of the processing chamber 12, and hence the substrate is not damaged by the microwaves.

Figure 3:
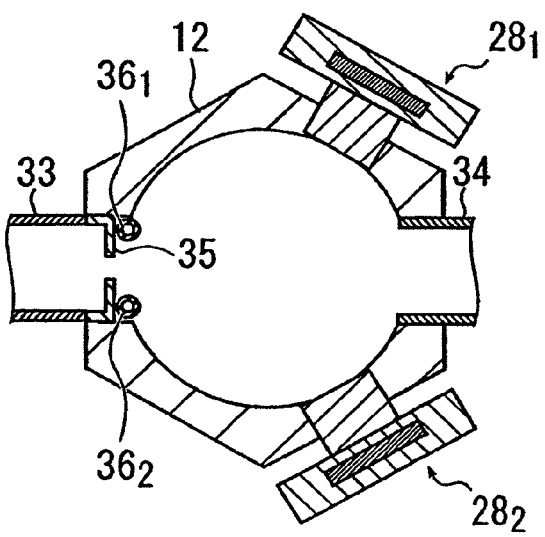
FIG. 3 is a sectional view along line A-A in FIG. 2.

FIG. 3 is a sectional view along line A-A in FIG. 2. Pipes $36_1$ and $36_2$ are arranged on the opposite sides of the shower nozzle 35, and these pipes $36_1$ and $36_2$ are connected to the etching gas supply system 37. A plurality of exhaust nozzles is provided in the sides of the pipes $36_1$ and $36_2$ facing towards the inside of the processing chamber 12 (the center of the substrates 15 carried into the processing chamber 12), and the gas from the etching gas supply system 37 is introduced into the processing chamber 12 via the respective exhaust nozzles.

One or more lamp heaters $28_1$ and $28_2$ are fitted to the sidewall of the processing chamber 12, and when a power source (not shown) is activated to switch on the lamp heaters $28_1$ and $28_2$, infrared rays are emitted to the inside of the processing chamber 12 from the lamp heaters $28_1$ and $28_2$.

The process for etching the etching object by using the etching apparatus 1 will be described below.

Figure 4:
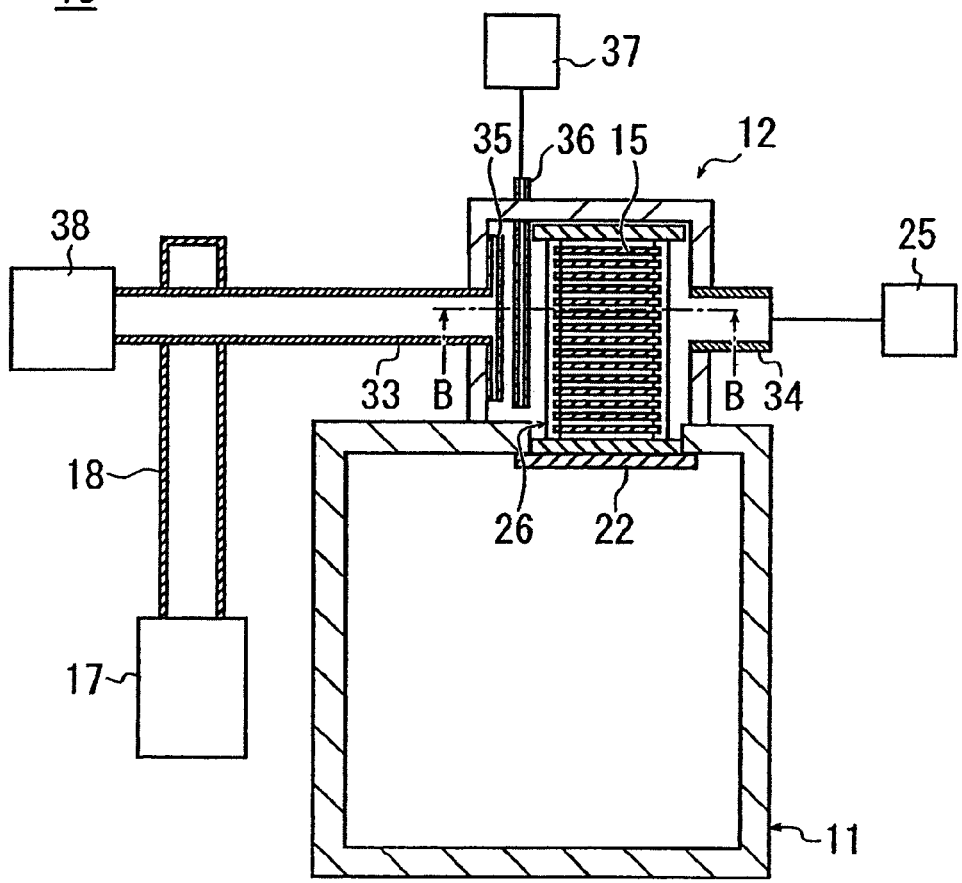
FIG. 4 is a sectional view for explaining a state in which substrates are carried into a processing chamber.
Figure 5:
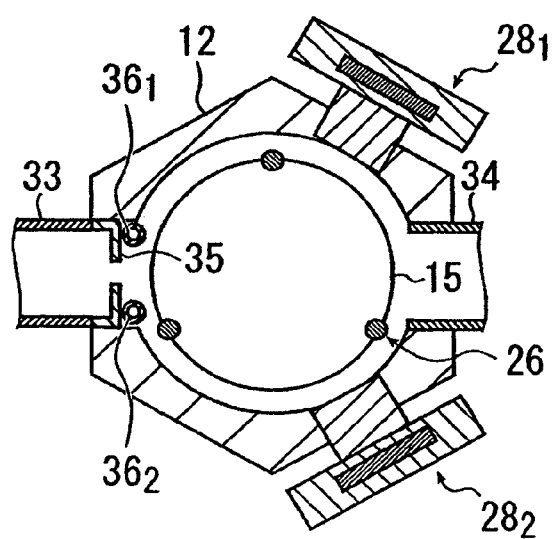
FIG. 5 is a sectional view along line B-B in FIG. 4.

FIG. 4 shows the state in which the boat 26 on which a plurality of substrates 15 is loaded is carried into the processing chamber 12, and FIG. 5 is a sectional view along line B-B in FIG. 4. In this state, valves of the respective gas supply systems 37 and 38 are closed, and the pressure in the processing chamber 12 is set to the first pressure range.

At first, the valve of the etching gas supply system 37 is opened, and the etching gas, being the fluoride gas (here, nitrogen trifluoride gas ($NF_3$)), is introduced into the processing chamber 12. In this case, the pipes $36_1$ and $36_2$ are aligned in the vertical direction, and the exhaust nozzles are facing the center of the substrates 15 between the individual substrates 15. Therefore, the etching gas introduced from the exhaust nozzles flows between the substrates 15, goes through the central part of the substrates 15, and is discharged from the exhaust pipe 34.

When the flow rate of the etching gas is gradually increased, while continuing exhaust at a predetermined exhaust rate, the pressure in the processing chamber 12 gradually rises. When the pressure in the processing chamber 12 becomes the second pressure range of $6.67 \times 10$ Pa (0.5 Torr) or higher, the flow rate of the etching gas is made constant, and the exhaust valve of the evacuation system 25 is adjusted to maintain the pressure in the processing chamber 12 in the second pressure range.

At this time, since the free radicals have not yet been introduced into the processing chamber 12, and the etching gas alone does not react with the etching object, the etching gas is adsorbed on the surface of the substrate 15, without reacting with the etching object.

After the pressure in the processing chamber 12 has reached the second pressure range, the pressure in the second pressure range is maintained for a predetermined adsorption time so that a sufficient amount of etching gas is adsorbed on the surfaces of all substrates 15 (adsorbed state).

The respective substrates 15 are rotated about the central axis of the substrates 15 together with the boat 26 by a rotation mechanism (not shown) until the adsorption time has passed, and the surfaces of the substrates 15 are uniformly exposed to the etching gas due to the rotation. As a result, the etching gas is uniformly adsorbed on the surfaces of the respective substrates 15.

After the adsorption time has passed, while continuing the introduction of the etching gas and the rotation of the substrates 15, the valve of the radical formation gas supply system 38 is opened, to introduce the radical formation gas formed of an ammonia gas and the carrier gas formed of a nitrogen gas together into the processing chamber 12. In this case, the flow rate of the radical formation gas and the carrier gas is gradually increased, while maintaining the pressure in the processing chamber 12 at the second pressure by enlarging the opening of the exhaust valve.

When the flow rates of the radical formation gas and the carrier gas have reached the predetermined flow rate respectively, the microwave source 17 is activated while maintaining the flow rate thereof constant, so that the radical formation gas is changed into plasma, to produce free radicals, and the free radicals are introduced into the processing chamber 12 from the shower nozzle 35.

As described above, the pipes $36_1$ and $36_2$ are arranged on the opposite sides of the shower nozzle 35, and the exhaust nozzles of the shower nozzle 35 face the center of the substrates 15, as with the exhaust nozzles of the pipes $36_1$ and $36_2$. Accordingly, the free radicals introduced through the shower nozzle 35 are carried in the flow of the carrier gas and the etching gas, pass the central part of the substrates, and are exhausted from the exhaust pipe 34.

At this time, since the substrates 15 are rotating about the central axis of the substrate 15 together with the boat 26, the surfaces of the substrates 15 are uniformly exposed to the etching gas due to the rotation.

Here, the respective substrates 15 are formed of a silicon substrate, and the etching object formed of a silicon oxide film is formed on the surface of the substrates 15. When the surfaces of the substrates 15 are exposed to the free radicals, the etching gas adsorbed beforehand on the surfaces of the substrates 15 reacts with the free radicals to form an intermediate product, and the intermediate product further reacts with the etching object, to form a reaction product (reacted state).

When the free radicals are introduced into the processing chamber 12, a side product produced at the time of changing the gas into plasma, the unreacted radical formation gas, and the carrier gas are introduced together. However, these gases are exhausted by adjusting the opening of the evacuation system 25, to maintain the pressure in the processing chamber 12 in the second pressure range, so as to allow the reaction of the free radicals, the etching gas and the etching object to proceed.

After activating the microwave source 17, formation of the free radicals and introduction of the etching gas, the radical formation gas and the carrier gas are continued for a predetermined reaction time, and when the reaction of the etching object has proceeded sufficiently, activation of the microwave source 17 is stopped, so as to stop the introduction of the etching gas, the radical formation gas and the carrier gas.

When evacuation is continued with introduction of these gases being stopped, the pressure in the processing chamber 12 gradually decreases. After the pressure in the processing chamber 12 reaches the third pressure range lower than the second pressure range, the lamp heaters $28_1$ and $28_2$ are switched on, infrared rays are irradiated toward the inside of the processing chamber 12, and the respective substrates 15 are heated.

After the respective substrates 15 have reached a heating temperature of 100° C. or higher, the heating temperature is held for a predetermined heating time, so that the reaction product produced on the surfaces of the substrates 15 is thermally decomposed, and evaporated, and as a result, the reaction product is removed from the surfaces of the substrates 15.

After the heating time has passed, the lamp heaters $28_1$ and $28_2$ are switched off. Thereafter, the table 22 is lowered, and the substrates 15 loaded on the boat 26 are returned into the transfer chamber 11, where the evacuation atmosphere of a predetermined pressure is maintained.

When the substrates 15 are returned into the transfer chamber 11, and held therein for a predetermined cooling time, the substrates 15 are cooled. After the cooling time has passed, the substrates 15 are carried out from the transfer chamber 11. As a result, the etched substrates 15 can be taken out.

EXAMPLE

An example will be described below to explain the effect of the present invention.

50 pieces of silicon substrates 15 having a diameter of 8 inches were loaded on one boat 26, and subjected to the etching processing under conditions of the pressure before introduction of the etching gas and the pressure at the time of heating each being 4 Pa (0.003 Torr), the pressure at the time of introducing the free radicals being $4 \times 10^2$ Pa (3 Torrs), the adsorption time being one minute, the reaction time being 330 seconds, the flow rate of the etching gas in the adsorbed state and the reacted state each being 4 slm (slm=liter/min at 0° C.), the flow rates of the radical formation gas and the carrier gas in the reacted state being respectively 1.3 slm and 3.9 slm, the heating temperature being 130° C., and the switched on time of the lamp heaters $28_1$ and $28_2$ being 330 seconds.

In each substrate 15, the film thickness of the silicon oxide film before etching and the film thickness of the silicon oxide film after etching were respectively measured at a plurality of spots, to determine the etching amount at the respective measurement spots (a difference in film thickness before etching and after etching). Moreover, the etching rate of the respective substrates 15 was determined from the average of the etching amount at the respective measurement spots and the etching time, and the in-plane distribution of the etching amount was also determined.

The in-plane distribution of the etching amount of the etching amount measured for one substrate 15, stands for a value (unit: %) expressed by the following expression (4), where the maximum value of the etching amount is denoted by MAX, the minimum value of the etching amount is denoted by MIN, and the average value of the etching amount is denoted by AV, wherein the larger the value, the larger the difference in etching amount.

$$(MAX-MIN)/2AV \times 100 \tag{4}$$

Figure 6:
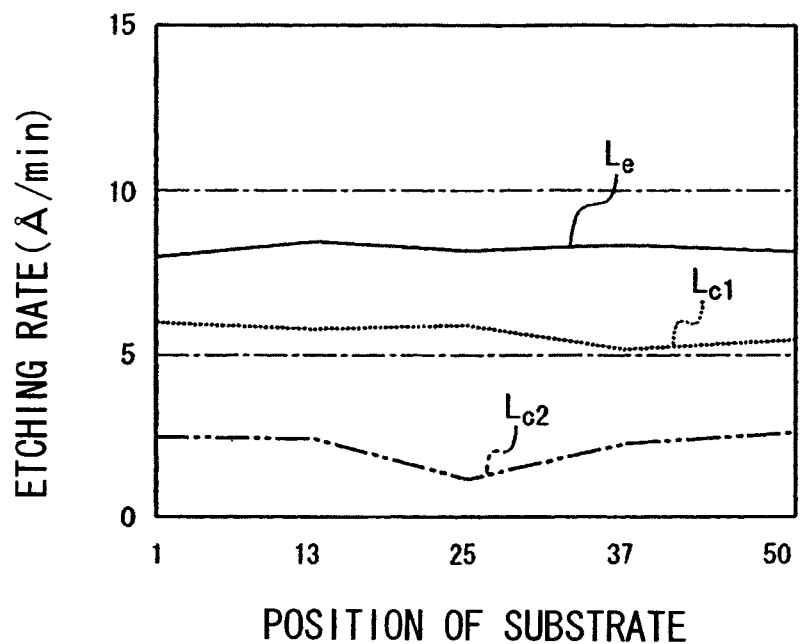
FIG. 6 is a graph for explaining the relation between the etching rate and the position of substrate.
Figure 7:
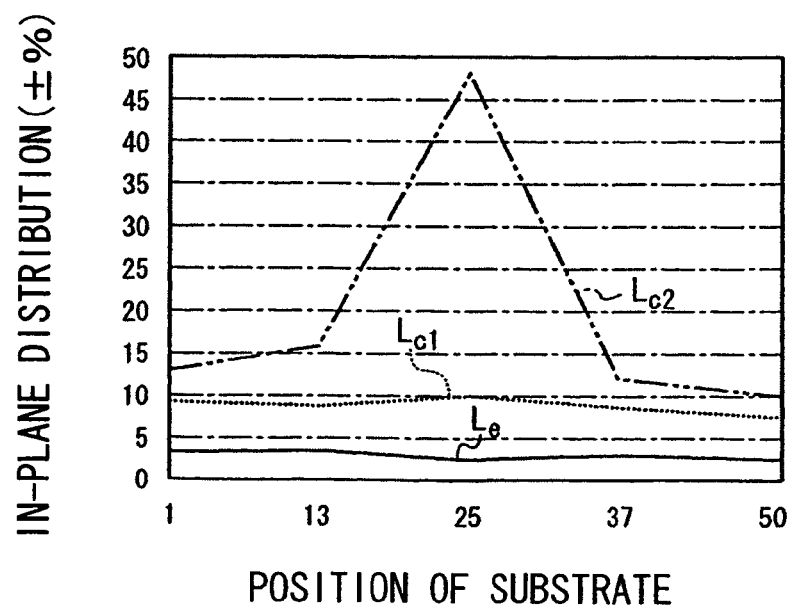
FIG. 7 is a graph for explaining the relation between in-plane distribution of the etching amount and the position of substrate.

FIG. 6 shows the determination result of the etching rate, and FIG. 7 shows the determination result of the in-plane distribution of the etching amount. In FIGS. 6 and 7, the etching rate and the in-plane distribution of the etching amount are respectively plotted on the Y axis, and the position of the substrate 15 is plotted on the X axis, when it is assumed that the lowest position at the time of carrying the boat 26 into the processing chamber 12 is 1 and the highest position is 50.

Reference symbol $L_e$ in FIGS. 6 and 7 denotes a case where the substrate is etched by the etching method of the present invention, and reference symbol $L_{c1}$ denotes a case where the free radicals are formed simultaneously upon start of introduction of the etching gas and the introduction of the radical formation gas and the carrier gas. Reference $L_{c2}$ denotes a case where the free radicals are formed by introducing the radical formation gas and the carrier gas, and after introducing the free radicals into the processing chamber 12 for 5 minutes, then introduction of the etching gas is started.

As is seen from FIG. 6, according to the etching method of the present invention, the etching rate is fast, and a difference in etching rate according to the position of the substrate is small, as compared with the case where the radical formation gas is first introduced, or where the radical formation gas and the etching gas are introduced at the same time.

As is seen from FIG. 7, when the radical formation gas is first introduced, a difference in in-plane distribution for each position of the substrate is large. According to the etching method of the present invention, however, not only the value of in-plane distribution is small, but also a difference in in-plane distribution for each position of the substrate is small.

From the above results, according to the present invention, not only the etching rate is fast, but also the value of in-plane distribution is small. Moreover, it can be confirmed that even when a plurality of substrates is simultaneously processed, a difference in in-plane distribution does not occur according to the position of the substrate in the processing chamber 12.

The preferred embodiment and example of the present invention have been described above, but the present invention is not limited thereto, and addition, omission, or replacement in the configuration, and various modifications are possible without departing from the scope of the present invention. In other words, the present invention is not limited by the explanation above, and is limited only by the scope of the claims.

For example, a case where the $NF_3$ gas, being the fluoride gas, is used as the etching gas at the time of etching the silicon oxide film has been described above, but the present invention is not limited thereto. When the silicon oxide film is etched, it is desirable to use a fluoride gas that does not contain carbon and oxygen in the chemical structure, and for example, a silicon fluoride gas such as $SF_6$ gas can be used. The fluoride gas to be used as the etching gas may be used in one kind, or may be used by combining two or more kinds of fluoride gases.

A case where the carrier gas is introduced together with the radical formation gas has been described above, but the present invention is not limited thereto, and the radical formation gas alone may be introduced into the processing chamber 12. Moreover, when the radical formation gas and the carrier gas are introduced together, the kind of the carrier gas is not limited to nitrogen gas, and various kinds of inert gas such as argon gas and xenon gas can be used.

Furthermore, the carrier gas can be introduced into the processing chamber 12 together with the etching gas. The carrier gas introduced together with the etching gas is not particularly limited, but one having a low chemical reactivity with respect to the substrate, the etching object and the free radicals is preferred, and for example, nitrogen gas, argon gas, xenon gas or the like can be used. The production method of the free radicals is not particularly limited, and for example, light such as visible light or ultraviolet light may be irradiated to the radical formation gas, to form the free radicals.

A case where ammonia gas is used as the radical formation gas has been described above, but the present invention is not limited thereto, and for example, hydrogen gas ($H_2$) may be used, so long as the free radicals can be formed.

What is claimed is:

1. An etching method comprising:
   arranging in a vacuum atmosphere a substrate having an etching object formed on a surface thereof;
   rendering said vacuum atmosphere in a first pressure value before or after said arrangement of the substrate;
   introducing an etching gas into said vacuum atmosphere such that said vacuum atmosphere has a second pressure value that is higher than the first pressure value;
   introducing free radicals into said vacuum atmosphere, while maintaining said vacuum atmosphere in said second pressure value;
   allowing said free radicals, said etching gas and said etching object to react with one another such that a reaction product is generated;
   heating the substrate to decompose said reaction product such that a pyrolysis gas is generated after setting the pressure in said vacuum atmosphere to a third pressure value lower than said second pressure value; and
   removing the pyrolysis gas by evacuation.

2. An etching method according to claim 1, wherein said second pressure value is a pressure equal to or higher than $6.67 \times 10$ Pa.

3. An etching method according to claim 1, wherein said second pressure value is a pressure equal to or higher than $6.67 \times 10$ Pa.

4. An etching method according to claim 2, wherein said second pressure value is a pressure equal to or lower than $1.33 \times 10^3$ Pa.

5. An etching method according to claim 3, wherein said second pressure value is a pressure equal to or lower than $1.33 \times 10^3$ Pa.

6. An etching method according to claim 1, wherein a fluoride gas which does not contain carbon and oxygen but contains fluorine in the chemical structure is used as said etching gas, and either one or both of a hydrogen gas and an ammonia gas are used as said radical formation gas, to etch an etching object formed of a silicon oxide.

7. An etching method according to claim 1, wherein a fluoride gas which does not contain carbon and oxygen but contains fluorine in the chemical structure is used as said etching gas, and either one or both of hydrogen gas and ammonia gas are used as said radical formation gas, to etch an etching object formed of a silicon oxide.

8. An etching method according to claim 2, wherein a fluoride gas which does not contain carbon and oxygen but contains fluorine in the chemical structure is used as said etching gas, and either one or both of hydrogen gas and ammonia gas are used as said radical formation gas, to etch an etching object formed of a silicon oxide.

9. An etching method according to claim 3, wherein a fluoride gas which does not contain carbon and oxygen but contains fluorine in the chemical structure is used as said etching gas, and either one or both of hydrogen gas and ammonia gas are used as said radical formation gas, to etch an etching object formed of a silicon oxide.

10. An etching method according to claim 4, wherein a fluoride gas which does not contain carbon and oxygen but contains fluorine in the chemical structure is used as said etching gas, and either one or both of hydrogen gas and ammonia gas are used as said radical formation gas, to etch an etching object formed of a silicon oxide.

11. An etching method according to claim 5, wherein a fluoride gas which does not contain carbon and oxygen but contains fluorine in the chemical structure is used as said etching gas, and either one or both of hydrogen gas and ammonia gas are used as said radical formation gas, to etch an etching object formed of a silicon oxide.

* * * * *